(12) United States Patent
Smith et al.

(10) Patent No.: US 10,224,442 B2
(45) Date of Patent: Mar. 5, 2019

(54) METALLIZATION OF SOLAR CELLS WITH DIFFERENTIATED P-TYPE AND N-TYPE REGION ARCHITECTURES

(71) Applicant: SUNPOWER CORPORATION, San Jose, CA (US)

(72) Inventors: David D. Smith, Campbell, CA (US); Timothy Weidman, Sunnyvale, CA (US); Scott Harrington, Oakland, CA (US); Venkatasubramani Balu, Santa Clara, CA (US)

(73) Assignee: SunPower Corporation, San Jose, CA (US)

( * ) Notice: Subject to any disclaimer, the term of this patent is extended or adjusted under 35 U.S.C. 154(b) by 97 days.

(21) Appl. No.: 15/334,706

(22) Filed: Oct. 26, 2016

(65) Prior Publication Data
US 2017/0288074 A1    Oct. 5, 2017

Related U.S. Application Data

(62) Division of application No. 15/089,382, filed on Apr. 1, 2016, now Pat. No. 9,502,601.

(51) Int. Cl.
*H01L 31/0236* (2006.01)
*H01L 31/0352* (2006.01)
(Continued)

(52) U.S. Cl.
CPC .......... *H01L 31/022441* (2013.01); *H01L 31/02167* (2013.01); *H01L 31/02363* (2013.01);
(Continued)

(58) Field of Classification Search
CPC ....... H01L 31/022441; H01L 31/02167; H01L 31/02363; H01L 31/035281; H01L 31/02;
(Continued)

(56) References Cited

U.S. PATENT DOCUMENTS

| 7,718,888 B2 | 5/2010 | Cousins |
| 7,737,357 B2 | 6/2010 | Cousins |

(Continued)

FOREIGN PATENT DOCUMENTS

WO    2013096500 A1    6/2013

OTHER PUBLICATIONS

International Search Report and Written Opinion from PCT/US2017/025574 dated Jul. 17, 2017, 26 pgs.
(Continued)

*Primary Examiner* — Susan D Leong
(74) *Attorney, Agent, or Firm* — Schwabe, Williamson & Wyatt, P.C.

(57) ABSTRACT

Methods of fabricating solar cell emitter regions with differentiated P-type and N-type regions architectures, and resulting solar cells, are described. In an example, a back contact solar cell can include a substrate having a light-receiving surface and a back surface. A first polycrystalline silicon emitter region of a first conductivity type is disposed on a first thin dielectric layer disposed on the back surface of the substrate. A second polycrystalline silicon emitter region of a second, different, conductivity type is disposed on a second thin dielectric layer disposed on the back surface of the substrate. A third thin dielectric layer is disposed over an exposed outer portion of the first polycrystalline silicon emitter region and is disposed laterally directly between the first and second polycrystalline silicon emitter regions. A first conductive contact structure is disposed on the first polycrystalline silicon emitter region. A second conductive contact structure is disposed on the second polycrystalline silicon emitter region. Metallization methods, include etching techniques for forming a first and second conductive contact structure are also described.

20 Claims, 10 Drawing Sheets

(51) Int. Cl.
*H01L 33/44* (2010.01)
*H01L 31/0224* (2006.01)
*H01L 31/0216* (2014.01)
*H01L 31/0745* (2012.01)

(52) U.S. Cl.
CPC .......... *H01L 31/02366* (2013.01); *H01L 31/035281* (2013.01); *H01L 31/0745* (2013.01); *Y02E 10/50* (2013.01)

(58) Field of Classification Search
CPC ........... H01L 31/0216; H01L 31/0236; H01L 31/036; H01L 31/0392
See application file for complete search history.

(56) References Cited

U.S. PATENT DOCUMENTS

| | | | |
|---|---|---|---|
| 8,815,631 | B2 | 8/2014 | Cousins |
| 9,196,758 | B2* | 11/2015 | Rim ................ H01L 31/022441 |
| 9,252,301 | B2 | 2/2016 | Morigami et al. |
| 9,257,593 | B2 | 2/2016 | Hashiguchi et al. |
| 9,269,839 | B2 | 2/2016 | Lee et al. |
| 9,362,426 | B2 | 6/2016 | Goto et al. |
| 9,837,576 | B2* | 12/2017 | Westerberg ......... H01L 31/1872 |
| 2008/0216887 | A1 | 9/2008 | Hacke et al. |
| 2009/0308438 | A1* | 12/2009 | De Ceuster ..... H01L 31/022441 136/255 |
| 2012/0204938 | A1 | 8/2012 | Hacke et al. |
| 2012/0222735 | A1* | 9/2012 | Xu ........................ H01L 31/068 136/256 |
| 2013/0164879 | A1* | 6/2013 | Cousins ............ H01L 31/02168 438/71 |
| 2014/0020752 | A1 | 1/2014 | Arimoto et al. |
| 2014/0370644 | A1* | 12/2014 | Nakasu ........... H01L 31/022441 438/71 |
| 2016/0043267 | A1 | 2/2016 | Rim et al. |
| 2016/0056322 | A1 | 2/2016 | Yang et al. |
| 2016/0093758 | A1 | 3/2016 | Fujishima |
| 2016/0126368 | A1 | 5/2016 | Lee et al. |
| 2016/0155866 | A1 | 6/2016 | Ha et al. |
| 2016/0155877 | A1 | 6/2016 | Chung et al. |
| 2016/0155885 | A1 | 6/2016 | Shim et al. |
| 2016/0181461 | A1 | 6/2016 | Ueyama et al. |
| 2016/0197210 | A1 | 7/2016 | Hayashi et al. |
| 2016/0240704 | A1 | 8/2016 | Shim |
| 2016/0240705 | A1 | 8/2016 | Takahama |
| 2016/0268454 | A1 | 9/2016 | Gwon |
| 2016/0284885 | A1 | 9/2016 | Westerberg et al. |
| 2017/0222072 | A1* | 8/2017 | Rim ................ H01L 31/022433 |

OTHER PUBLICATIONS

International Preliminary Report on Patentability from PCT/US2017/025574 dated Oct. 11, 2018, 22 pgs.

* cited by examiner

METALLIZATION OF SOLAR CELLS WITH DIFFERENTIATED P-TYPE AND N-TYPE REGION ARCHITECTURES

CROSS-REFERENCE TO RELATED APPLICATIONS

This application is a divisional of U.S. patent application Ser. No. 15/089,382, filed on Apr. 1, 2016, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
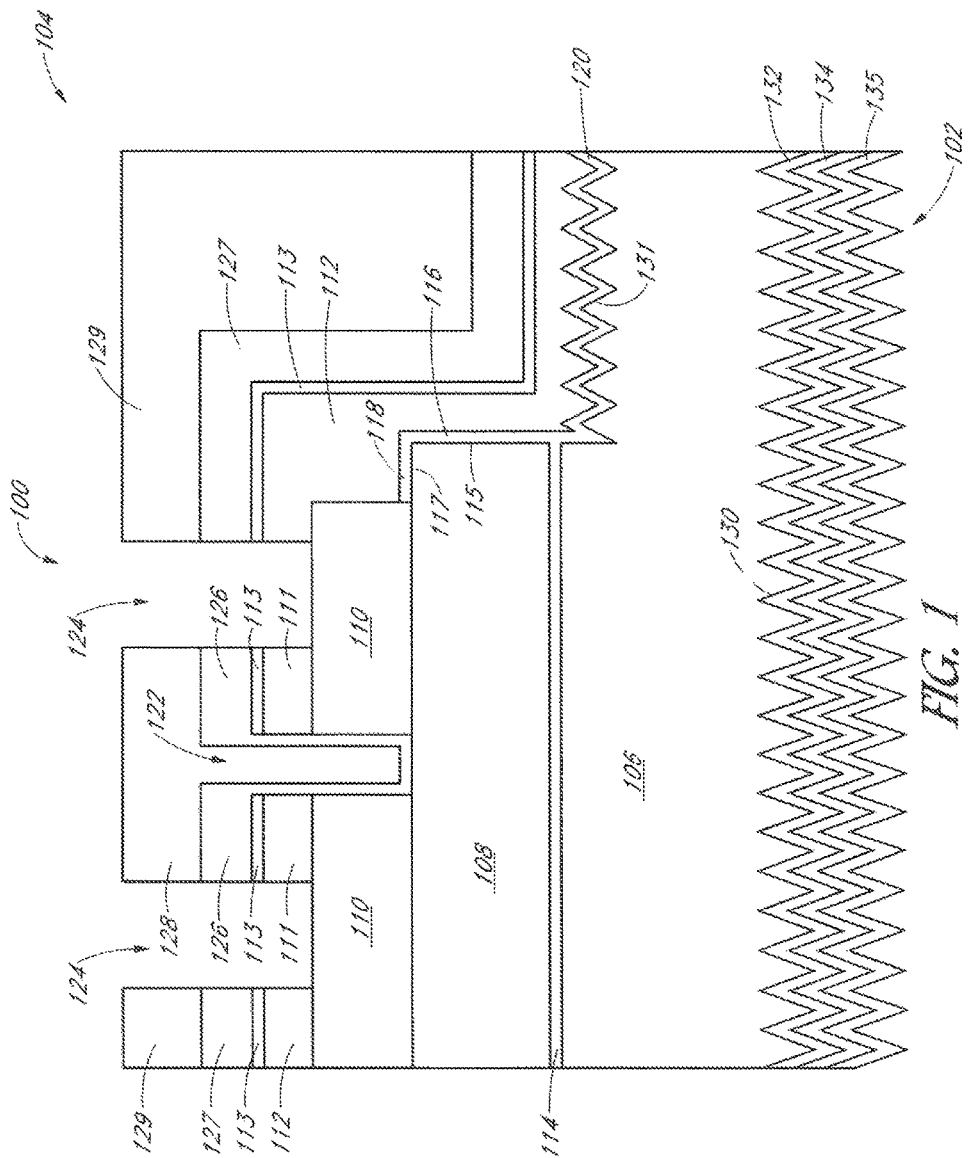
FIG. 1 illustrates a cross-sectional view of a portion of a back contact solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" silicon region does not necessarily imply that this silicon region is the first silicon region in a sequence; instead the term "first" is used to differentiate this silicon region from another silicon region (e.g., a "second" silicon region). In an example, a silicon region can be a polycrystalline silicon emitter region. In one example, a first silicon region can be a first polycrystalline silicon emitter region, where multiple silicon regions can be formed (e.g., a second silicon region, a second polycrystalline silicon emitter region).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Methods of fabricating solar cell emitter regions with differentiated P-type and N-type region architectures, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a back contact solar cell includes a substrate having a light-receiving surface and a back surface. In an embodiment, a first polycrystalline silicon emitter region of a first conductivity type is disposed on a first thin dielectric layer disposed on the back surface of the substrate. In one embodiment, a second polycrystalline silicon emitter region of a second, different, conductivity type is disposed on a second thin dielectric layer disposed on the back surface of the substrate. In an example, the first conductivity type can be P-type and the second conductivity type can be N-type. In an embodiment, a third thin dielectric layer is disposed over an exposed outer portion of the first polycrystalline silicon emitter region and is disposed laterally directly between the first and second polycrystalline silicon emitter regions. In an embodiment, a first conductive contact structure is disposed on the first polycrystalline silicon emitter region. In one embodiment, a second conductive contact structure is disposed on the second polycrystalline silicon emitter region.

In an example, FIG. 1 illustrates a cross-sectional view of a portion of a back contact solar cell 100, according to some embodiments. In an embodiment, the solar cell 100 can include a substrate 106 having a light-receiving surface 102 and a back surface 104. In one embodiment, a first polycrystalline silicon emitter region 108 of a first conductivity type can be disposed on a first thin dielectric layer 114 disposed on the back surface 104 of the substrate 106. In a specific embodiment, the first conductivity type is P-type (e.g., formed using boron impurity atoms). In an embodiment, a second polycrystalline silicon emitter region 112 of a second, different, conductivity type can be disposed on a second thin dielectric layer 120 disposed on the back surface 104 of the substrate 106. In a specific embodiment, the second conductivity type is N-type (e.g., formed using phosphorus atoms or arsenic impurity atoms). In one embodiment, a third thin dielectric layer 116, 118 can be disposed over 118 an exposed outer portion 117 of the first polycrystalline silicon emitter region and can be disposed laterally 116 over a lateral portion 115 of the first polycrystalline silicon, directly between the first 108 and second 112 polycrystalline silicon emitter regions. In an embodiment, a first conductive contact structure 128 can be disposed over the first polycrystalline silicon emitter region 108. In an embodiment, a second conductive contact structure 129 can be disposed over the second polycrystalline silicon emitter region 112. In an embodiment, the first and second conductive contacts 128, 129 can include a plated metal. In one example, the first and second conductive contacts 128, 129 can include copper, tin, and nickel, among other metals. In some embodiments, the first and second conductive contacts 128, 129 can include a metal foil. In an example, the first and second conductive contacts 128, 129 can include aluminum or aluminum foil. In an embodiment, a separation region 124 can separate the first conductive contact structure 128 from the second conductive contact structure 129. In some embodiments, a laser ablation process can be used to separate 124 the first conductive contact structure 128 from the second conductive contact structure 129

Referring again to FIG. 1, in an embodiment, the solar cell 100 can further include an insulator layer 110 disposed on the first polycrystalline silicon emitter region 108. In one example, the insulator layer 110 can be an oxynitride or a nitride. In an embodiment, the first conductive contact structure 128 can be disposed through the insulator layer 110. In one embodiment, a portion 111 of the second polycrystalline silicon emitter region of the second conductivity type can overlap the insulator layer 110 but is separate from the first conductive contact structure 128. In an embodiment, the portion 111 of the second polycrystalline silicon emitter region of the second conductivity type can be disposed on the insulator layer 110, and the first conductive contact structure 128 can be disposed through the polycrystalline silicon layer 111 of the second conductivity type and through the insulator layer 110, as is depicted in FIG. 1. In one embodiment, the portion 111 of the second polycrystalline silicon emitter region and the second polycrystalline silicon emitter region 112 can be formed from a same layer that is blanket deposited.

With reference to FIG. 1, an additional silicon region 113 can be disposed on the second polycrystalline silicon emitter regions 111, 112. In an embodiment, the additional silicon region 113 can be amorphous silicon or silicon nitride. In one embodiment, the additional silicon region 113 can be a passivation region and/or an anti-reflective coating (ARC). In some embodiments, the additional silicon region 113 need not be formed.

Referring again to FIG. 1, in an embodiment, the solar cell 100 further includes a recess 131 disposed in the back surface 104 of the substrate 106. In an embodiment, the second polycrystalline silicon emitter region 112 and the second thin dielectric layer 120 can be disposed in the recess 131. In one such embodiment, the recess 131 can have a texturized surface, and the second polycrystalline silicon emitter region 112 and the second thin dielectric layer 120 can be conformal with the texturized surface, as is depicted in FIG. 1. In an embodiment, the first polycrystalline silicon emitter region 108 and the first thin dielectric layer 114 are disposed on a flat portion of the back surface 104 of the substrate 106, and the second polycrystalline silicon emitter region 112 and the second thin dielectric layer 120 are disposed on a texturized portion of the back surface 104 of the substrate 106, as is depicted in FIG. 1. It is to be appreciated, however, that other embodiments may not include a texturized surface, or may not include a recess altogether.

Referring once again to FIG. 1, in an embodiment, the solar cell 100 further includes a fourth thin dielectric layer 132 disposed on a light-receiving surface 130 of the substrate 106. A polycrystalline silicon layer 134 of the second conductivity type can be disposed on the fourth thin dielectric layer 132. An anti-reflective coating (ARC) layer 135, such as a layer of silicon nitride, can be disposed on the polycrystalline silicon layer 134. In one such embodiment, the fourth thin dielectric layer 132 can be formed by essentially the same process used to form the second thin dielectric layer 120 and/or the third thin dielectric layer 116, 118. In an embodiment, the polycrystalline silicon layer 134 can be formed by essentially the same process used to form the second polycrystalline silicon emitter regions 111, 112.

In some embodiments, the first polycrystalline silicon emitter region 108 can be a P-type polycrystalline silicon emitter region. In one embodiment, the second polycrystalline silicon emitter region 112 can be an N-type polycrystalline silicon emitter region. In an embodiment, the substrate 106 can be an N-type monocrystalline silicon substrate. In an embodiment, the first thin dielectric layer 114, the second thin dielectric layer 120 and the third thin dielectric layer 116, 118 can include silicon dioxide. However, in another embodiment, the first thin dielectric layer 114 and the second thin dielectric layer 120 include silicon dioxide, while the third thin dielectric layer 116, 118 includes silicon nitride. In an embodiment, insulator layer 110 includes silicon dioxide.

In an embodiment, a metal seed layer 126, 127 can be disposed between the first and second polycrystalline silicon emitter regions 108, 112 and the first and second conductive contact structures 128, 129. In an embodiment, the first and second conductive contact structures 128, 129 can include portions 126, 127 of the metal seed layer, respectively. In an embodiment, the metal seed layer 126, 127 can be an aluminum-based metal seed layer. In one such embodiment, the aluminum-based metal seed layer can have a thickness approximately in the range of 0.3 to 20 microns and include aluminum in an amount greater than approximately 97% and silicon in an amount approximately in the range of 0-2%. In an example, the metal seed layer 126, 127 can include copper, titanium, titanium tungsten, nickel, and/or aluminum, among other metals. In an embodiment, the metal seed layer 126, 127 is formed from a blanket deposition process. In an embodiment, a first and second portion 126, 127 of the metal seed layer can be disposed over the first 108 and second 112 polycrystalline silicon emitter regions, respectively. In one embodiment, each of the first conductive contact structure 128 and the second conductive contact structure 129 can include copper, tin, nickel, and/or aluminum, among other metals.

Figure 2:
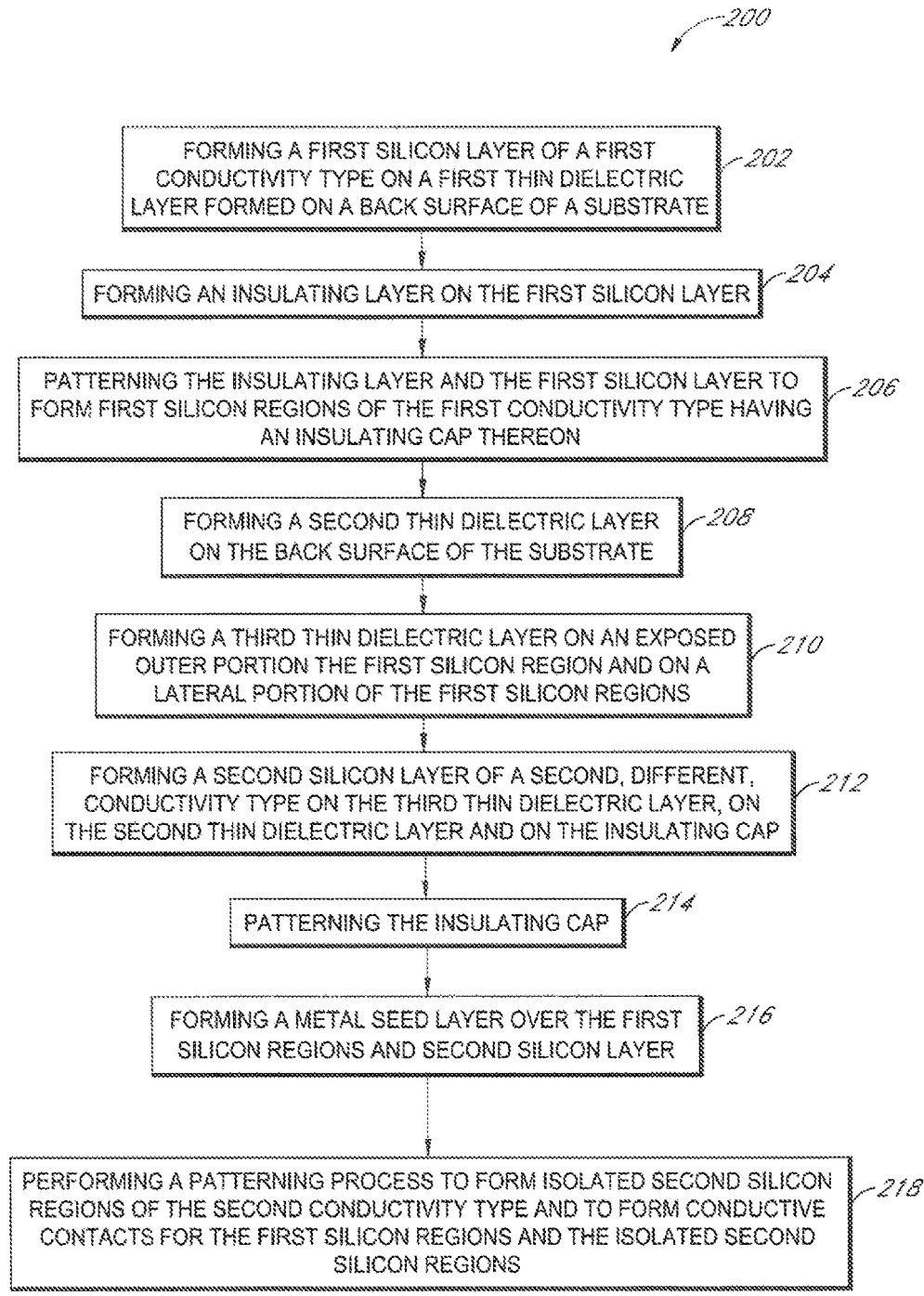
FIG. 2 is a flowchart listing operations in a method of fabricating a solar cell corresponding to FIGS. 5-16 according to some embodiments.

Disclosed herein are methods of fabricating solar cells. In an exemplary process flow, FIGS. 5-16 illustrate cross-sectional views of various stages in the fabrication of a solar cell, in accordance with an embodiment of the present disclosure. FIG. 2 is a flowchart 200 listing operations in a method of fabricating a solar cell corresponding to FIGS. 5-16, according to some embodiments. In various embodiments, the method of FIG. 2 can include additional (or fewer) blocks than illustrated. For example, in some embodiments, a metal seed layer need not be formed at block 216, where conductive contacts can instead be formed directly on a back surface of the solar cell.

Figure 3:
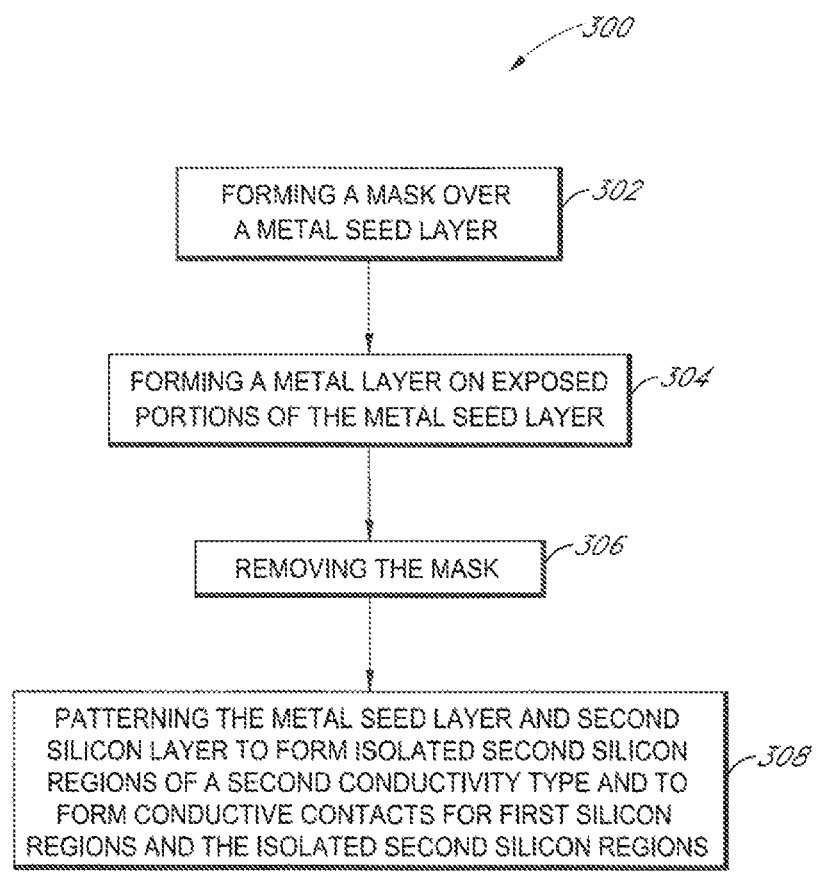
FIG. 3 is a flowchart listing operations in a patterning process for a solar cell corresponding to FIGS. 11-13, according to some embodiments.
Figure 11:
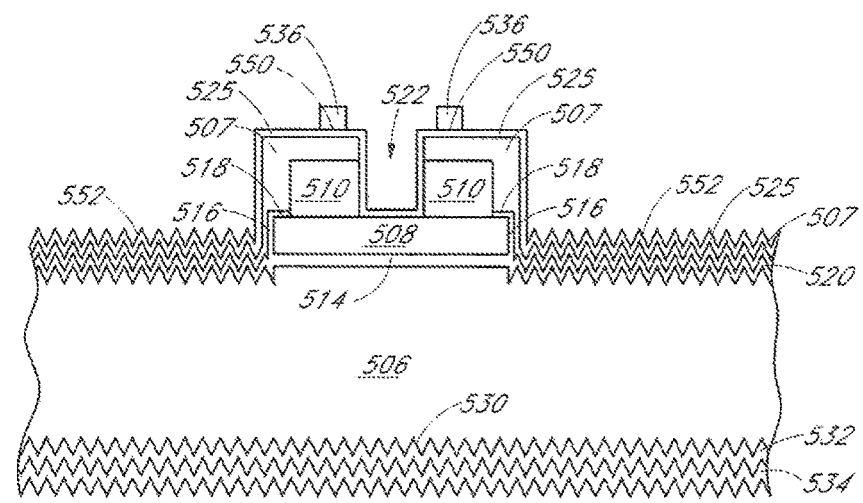
FIGS. 11-13 illustrate cross-sectional views in a patterning process for a solar cell, according to some embodiments.
Figure 12:
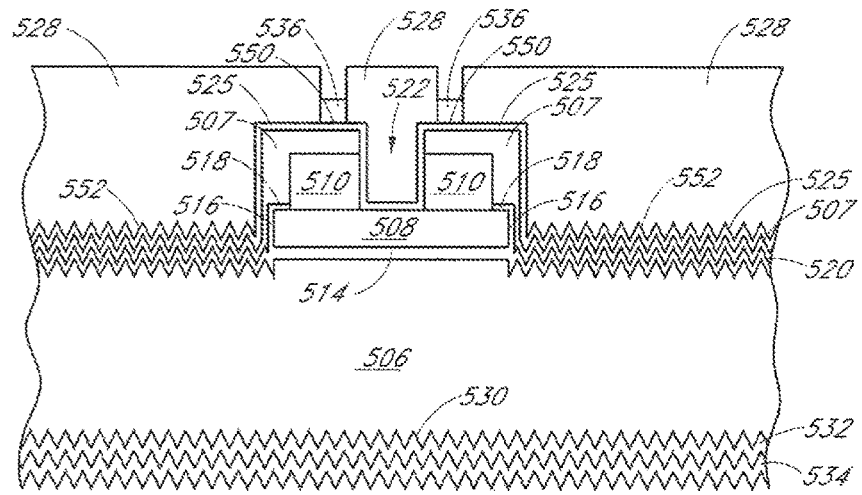
Figure 13:
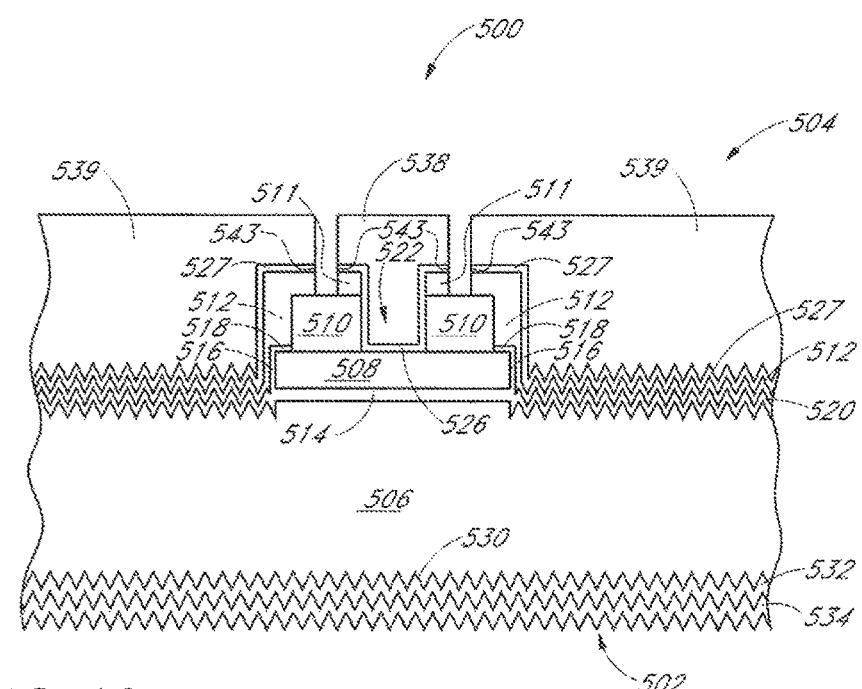

Disclosed herein are patterning processes for solar cells. In a one exemplary process flow, FIGS. 11-13 illustrate cross-sectional views of various stages in the formation of conductive contacts of a solar cell, in accordance with an embodiment of the present disclosure. FIG. 3 is a flowchart 300 listing operations in one patterning process of a solar cell corresponding to FIGS. 11-13, according to some embodiments.

Figure 4:
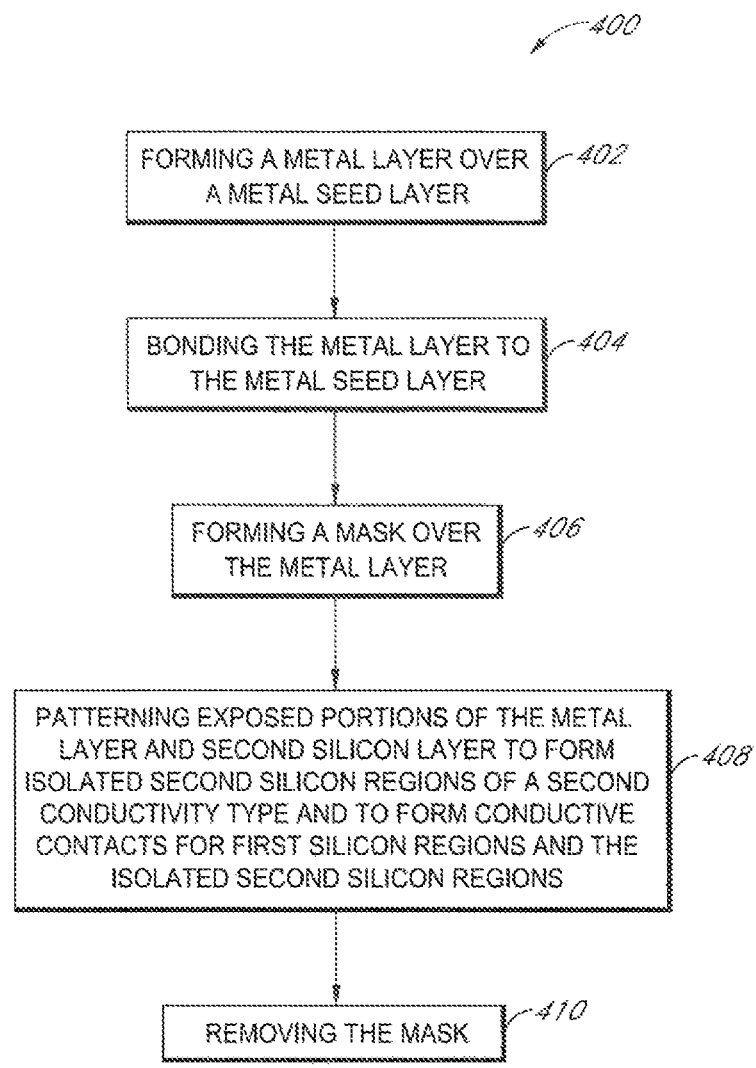
FIG. 4 is a flowchart listing operations in another patterning process for a solar cell corresponding to FIGS. 14-16, according to some embodiments.
Figure 14:
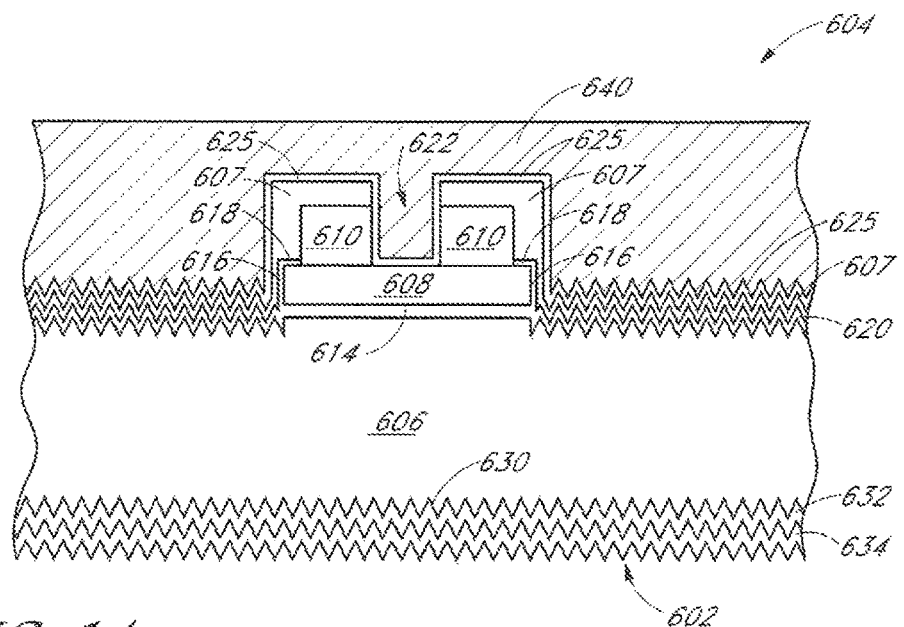
FIGS. 14-16 illustrate cross-sectional views of various stages in another patterning process for a solar cell, according to some embodiments.
Figure 15:
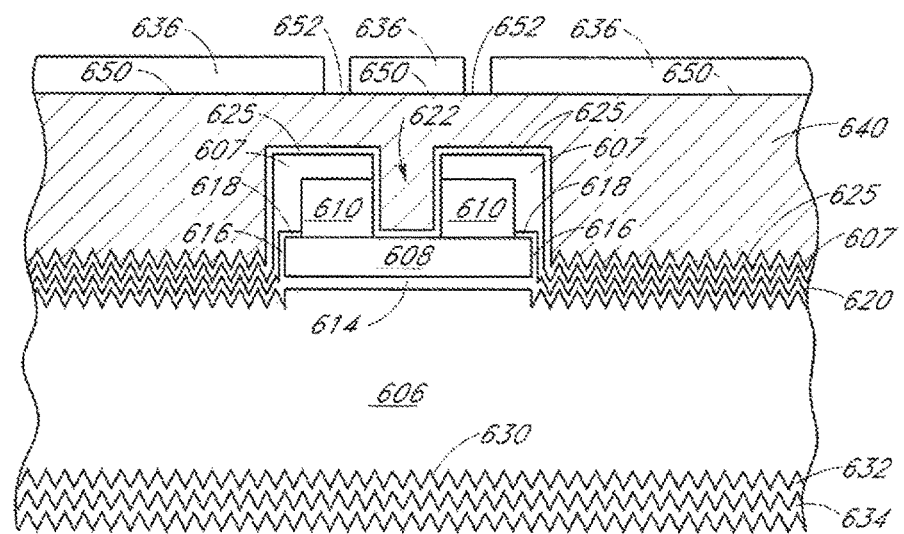
Figure 16:
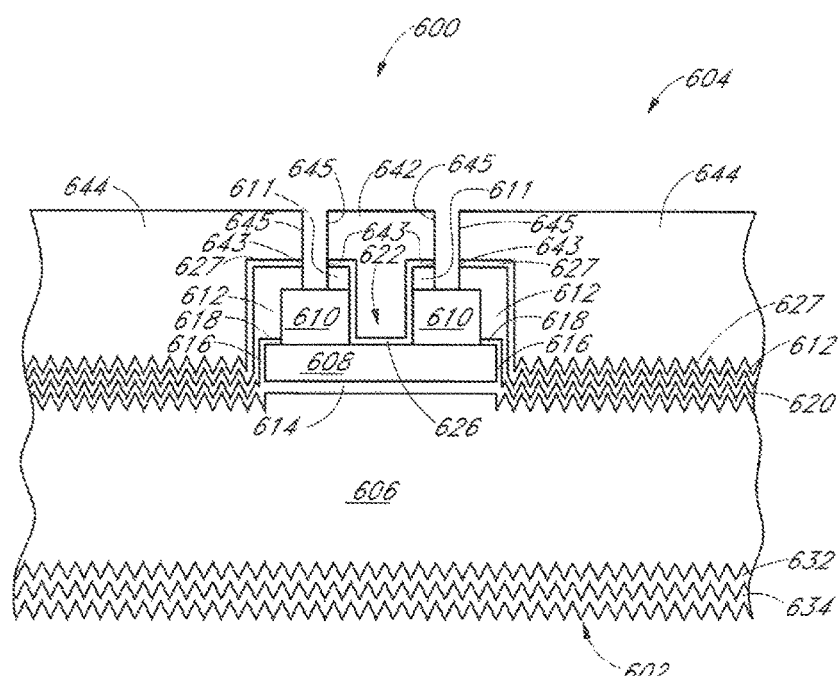

Also, disclosed herein is another patterning process for a solar cell. In a an exemplary process flow, FIGS. 14-16 illustrate cross-sectional views of various stages in the formation of conductive contacts of a solar cell, in accordance with an embodiment of the present disclosure. FIG. 4 is a flowchart 400 listing operations in a patterning process of a solar cell corresponding to FIGS. 14-16, according to some embodiments.

Figure 5:
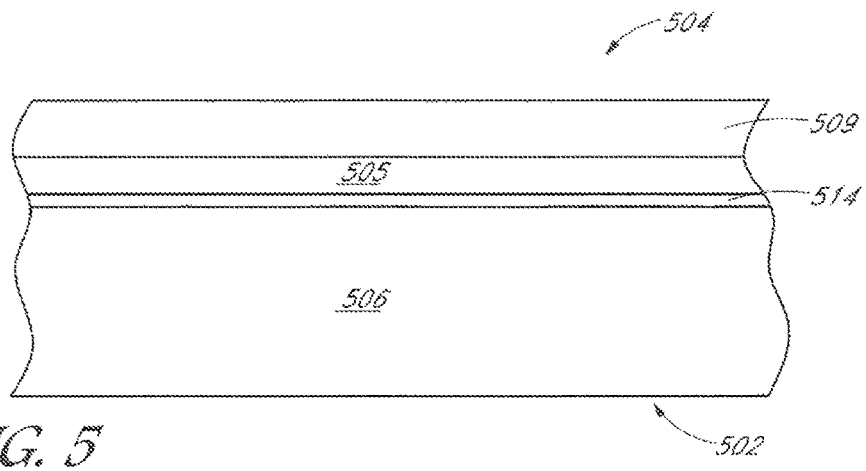
FIGS. 5-10 illustrate cross-sectional views of various stages in the fabrication of a solar cell, according to some embodiments.

Referring to FIG. 5 and corresponding operation 202 of flowchart 200, a method of fabricating alternating N-type and P-type emitter regions of a solar cell can include forming a first silicon layer 505 of a first conductivity type on a first thin dielectric layer 514 formed on a back surface 504 of a substrate 506.

In an embodiment, the substrate 506 can be a monocrystalline silicon substrate, such as a bulk single crystalline N-type doped silicon substrate. It is to be understood, however, that substrate 506 may be a layer, such as a multi-crystalline silicon layer, disposed on a global solar cell substrate. In an embodiment, the substrate 506 can have a front side 502 and a back side 504, where the front side 502 is opposite the back side 504. In one embodiment, the front side 502 can be referred to as a light receiving surface 502 and the back side can be referred to as a back surface 504. In an embodiment, the first thin dielectric layer 514 can be a thin oxide layer such as a tunnel dielectric silicon oxide layer having a thickness of approximately 2 nanometers or less.

In an embodiment, the first silicon layer 505 can be a polycrystalline silicon layer that is doped to have the first conductivity type either through in situ doping, post deposition implanting, or a combination thereof. In another embodiment, the first silicon layer 505 can be an amorphous silicon layer such as a hydrogenated silicon layer represented by a-Si:H which is implanted with dopants of the first conductivity type subsequent to deposition of the amorphous silicon layer. In one such embodiment, the first silicon layer 505 can be subsequently annealed (at least at some subsequent stage of the process flow) to ultimately form a polycrystalline silicon layer. In an embodiment, for either a polycrystalline silicon layer or an amorphous silicon layer, if post deposition implantation can be performed, the implanting is performed by using ion beam implantation or plasma immersion implantation. In one such embodiment, a shadow mask can be used for the implanting. In a specific embodiment, the first conductivity type is P-type (e.g., formed using boron impurity atoms).

Referring again to FIG. 5 and now to corresponding operation 204 of flowchart 200, an insulating layer 509 can be formed on the first silicon layer 505. In an embodiment the insulating layer 509 can be silicon dioxide. In an example, a deposition process can be performed to form the first silicon layer 505.

Figure 6:
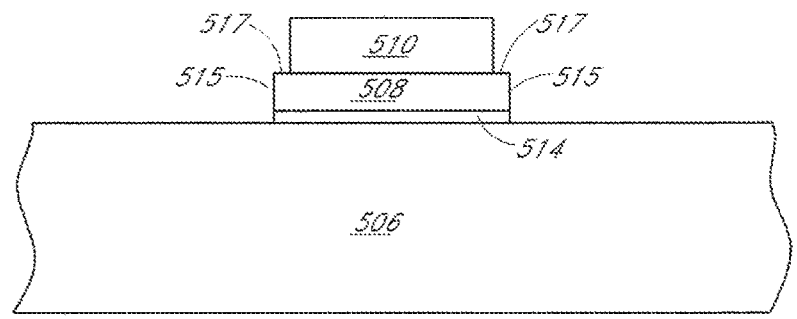

Referring to FIG. 6 and corresponding operation 206 of flowchart 200, the insulating layer 509 and the first silicon layer 505 of FIG. 5 can be patterned to form a first silicon region 508 of the first conductivity type having an insulating cap 510 thereon. In an embodiment, the insulating cap 510 can be formed from the patterning the insulating layer 509. In an embodiment, a lithographic or screen print masking and subsequent etch process can be used to pattern the insulating layer 509 and the first silicon layer 505. In another embodiment, a laser ablation process (e.g., direct write) can be used to pattern the insulating layer 509 and the first silicon layer 505. In either case, in one embodiment, the first thin dielectric layer 514 can also be patterned in an etching process. In an embodiment, the patterning can include forming an exposed outer portion 517 and a lateral portion 515 of the first silicon region 508.

Figure 7:
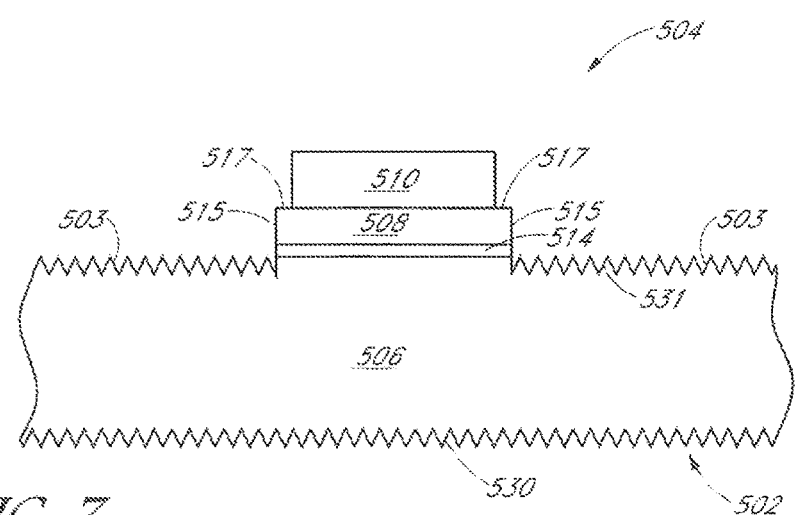

Referring to FIG. 7, optionally, recesses 503 may be formed in the substrate 506 during (or subsequent to) the patterning of the insulating layer 509 and the first silicon layer 505. Furthermore, in one embodiment, the surfaces 503 of the recesses 541 can be texturized. In a same or similar process, a light receiving surface 530 of the substrate 506 can also be texturized, as is depicted in FIG. 7. In an embodiment, a hydroxide-based wet etchant can be used to form at least a portion of the recesses 503 and/or to texturize exposed portions of the substrate 506. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back surface and even the recess formation may be omitted from the process flow.

Figure 8:
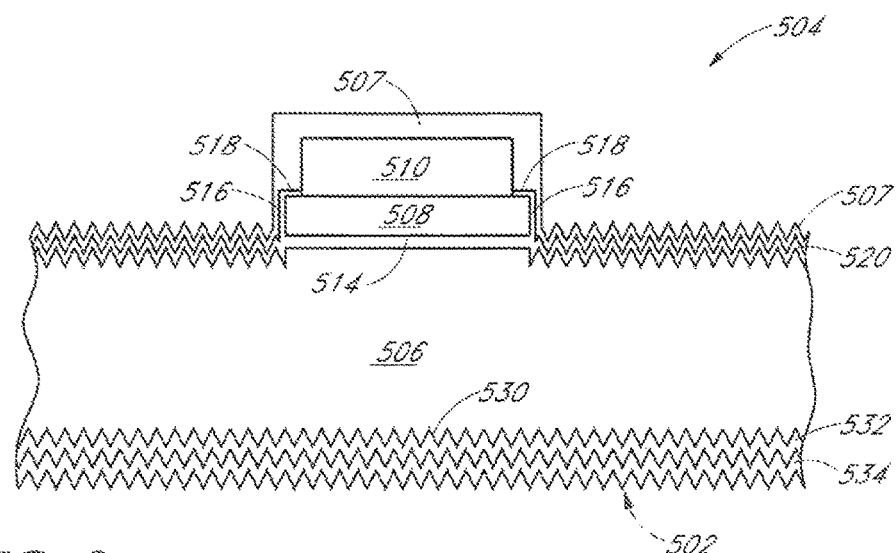
Figure 9:
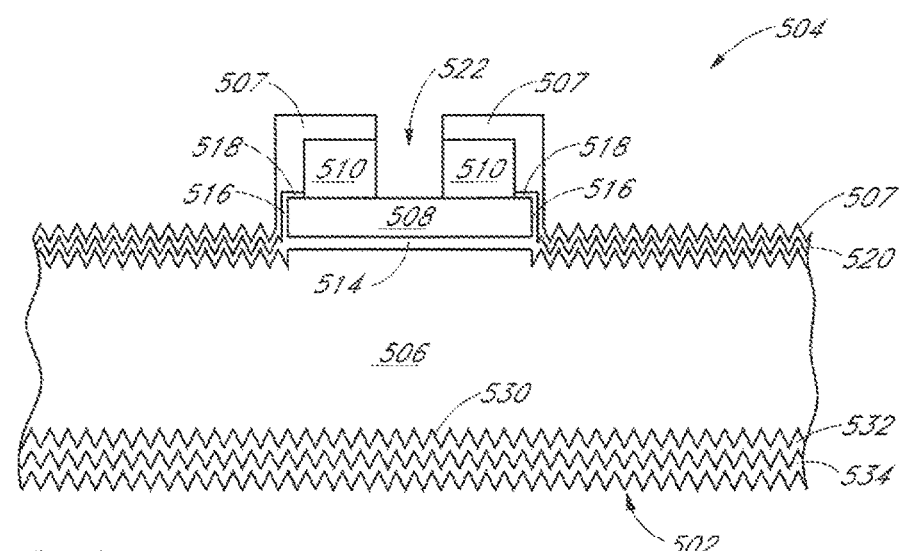
Figure 10:
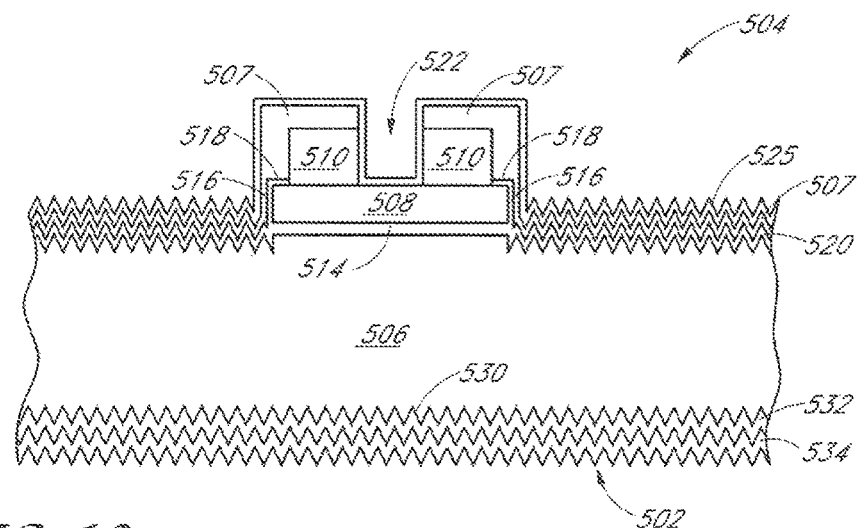

Referring to FIG. 8 and corresponding operation 208 of flowchart 200, a second thin dielectric layer 520 can be formed on the back surface 504 of the substrate 506. In an embodiment, the second thin dielectric layer 520 can be formed in an oxidation process and is a thin oxide layer such as a tunnel dielectric layer (e.g., silicon oxide). In one embodiment, the second thin dielectric layer 520 can be formed in a deposition process. In an embodiment, the second thin dielectric layer 520 is a thin oxide layer or silicon oxynitride layer. In an embodiment, the second thin dielectric layer can have a thickness of approximately 2 nanometers or less.

Referring again to FIG. 8 and now to corresponding operation 210 of flowchart 200, in an embodiment, a first portion 516 of the third thin dielectric layer can be formed on the lateral portions 515 of the first silicon region 508. In one embodiment, a second portion 518 of the of third thin dielectric layer can be formed on the exposed outer portions 517 of the first silicon region 508. In an embodiment, the third thin dielectric layer can include the first and second 516, 518 portions. In one embodiment, the third thin dielectric layer 516, 518 can be formed in an oxidation process and can be a thin oxide layer such as a tunnel dielectric layer (e.g., silicon oxide). In an embodiment, the third thin oxide layer can have a thickness of approximately 3 nanometers or less. In one embodiment, the third thin dielectric layer 516, 518 can be formed in a deposition process. In an embodiment, the third thin dielectric layer 516, 518 can be a thin oxide layer or silicon oxynitride layer. In an embodiment, the second and third thin dielectric layers 520, 516, 518 can be formed in the same oxidation and/or deposition process.

Referring once again to FIG. 8 and now to corresponding operation 212 of flowchart 200, a second silicon layer 507 of a second, different, conductivity type can be formed on the third thin dielectric layer 516, 518, on the second thin dielectric layer 520 and on the insulating cap 510 of the first silicon regions 508. In an embodiment, corresponding thin dielectric layer 532 and second silicon layer 534 of the second conductivity type can be formed on the light-receiving surface 530 of the substrate 506, in the same or similar process operations used to form the second silicon layer 507, second thin dielectric layer 520 and third thin dielectric layer 516, 518, as is depicted in FIG. 8. Additionally, although not depicted, an anti-reflective (ARC) layer may be formed on the corresponding second silicon layer 534, as described in association with FIG. 1. In an embodiment, the second silicon layer 507 can be a polycrystalline silicon layer that is doped to have the second conductivity type either through in situ doping, post deposition implanting, or a combination thereof. In another embodiment, the second silicon layer 507 can be an amorphous silicon layer such as a hydrogenated silicon layer represented by a-Si:H which is implanted with dopants of the second conductivity type subsequent to deposition of the amorphous silicon layer. In one such embodiment, the second silicon layer 507 can be subsequently annealed (at least at some subsequent stage of the process flow) to ultimately form a polycrystalline silicon layer. In an embodiment, for either a polycrystalline silicon layer or an amorphous silicon layer, if post deposition implantation is performed, the implanting can be performed by using ion beam implantation or plasma immersion implantation. In one such embodiment, a shadow mask can be used for the implanting. In a specific embodiment, the second conductivity type is N-type (e.g., formed using phosphorus atoms or arsenic impurity atoms). Additionally, although not depicted and subsequent to forming the second silicon layer 507, an additional silicon region can be formed on the second silicon layer 507 as described in association with FIG. 1. In one embodiment, the additional silicon region can be amorphous silicon or silicon nitride. In some embodiments, the additional silicon region can be a passivation region and/or an anti-reflective coating (ARC). In some embodiments, the additional silicon region need not be formed.

Referring again to FIG. 9 and now to corresponding operation 214 of flowchart 200, the insulating cap 510 can be patterned through the contact openings 522 to expose portions of the first silicon regions 508. In an embodiment, the insulating cap 510 is patterned using a laser ablation process. In one embodiment, a first laser pass can be used to pattern the second silicon layer 507, including forming contact opening 522. In an embodiment, subsequent to performing first laser pass, a second laser pass in the same location as contact opening 522 can be the used to pattern the insulating cap 510.

Referring again to FIG. 10 and now to corresponding operation 216 of flowchart 200, at metal seed layer 525 can be formed over the first silicon regions 508 and second silicon layer 507. In an embodiment, a deposition process can be performed to form the metal seed layer 525. In an example, a sputtering process can be used to form the metal seed layer 525. In one example, the metal seed layer 5257 is formed from a blanket deposition process. In an embodiment, the metal seed layer 525 can include one or more metals and/or metal alloys. In an example, the metal seed layer can include aluminum, titanium tungsten and/or copper, among other metals. In an embodiment, the metal seed layer 525 can include one, two or more layers. In an example, the metal seed layer 525 can include a first layer including copper, a second layer including tungsten and a third layer including aluminum. In some embodiments, an aluminum portion of the metal seed layer 525 can be disposed over the first silicon regions 508 and second silicon layer 507.

In some embodiments, the metal seed layer 525 need not be formed. In one example, a metal layer can instead be formed on, and directly contacting, the first silicon regions 508 and second silicon layer 507.

Referring to FIGS. 11-16 and now to corresponding operation 218 of flowchart 200, a patterning process can be performed. In an embodiment, the patterning process can include forming isolated second silicon regions of a second conductivity type. In one embodiment, the patterning process can include forming a first conductive contact for the first silicon regions and a second conductive contact for the isolated second silicon regions. In an embodiment, the patterning process can include performing a laser ablation process.

In an exemplary process flow, FIGS. 11-13 illustrate cross-sectional views of various stages in one example patterning process for a solar cell, in accordance with an embodiment of the present disclosure. In an embodiment, the patterning process of FIGS. 11-13 can include performing a plating and etching process. In an exemplary process flow, FIGS. 14-16 illustrate cross-sectional views of various stages in another patterning process for a solar cell, in accordance with an embodiment of the present disclosure. In an embodiment, the patterning process of FIGS. 14-16 can include performing a metal foil based bonding and etching process.

In an exemplary process flow, FIG. 3 is a flowchart 300 listing operations in a patterning process for a solar cell corresponding to FIGS. 11-13, according to some embodiments. In various embodiments, the method of FIG. 3 can include additional (or fewer) blocks than illustrated. For example, in some embodiments, a mask need not be removed at block 306, where the mask can instead be removed during a patterning process at block 308. Accordingly, the exemplary process flow moves from the structure of FIG. 10 to the structure of FIG. 11.

Referring to FIG. 11 and corresponding operation 302 of flowchart 300, a mask 536 can be formed over a metal seed layer 525, according to some embodiments. In an embodiment, the mask 536 can protect portions 550 of the metal seed layer 525 during a subsequent plating process, while exposed regions 552 can be plated during said plating process. In an embodiment, the mask 536 can be formed by screen printing, inkjet printing, among other printing processes. In one embodiment, the mask 536 can be an etch resist. In one embodiment, the etch resist can be an etch resist 536 commonly used in the fabrication or manufacture of solar cells. In some embodiments, the etch resist 536 is a plating resist.

Referring to FIG. 12 and corresponding operation 304 of flowchart 300, a metal layer 528 can be formed on exposed portions 552 of the metal seed layer 525. In an embodiment, a plating process can be performed to form the metal layer 528 on exposed portions 552 of the metal seed layer 525, where the mask 536 can protect portions 550 of the metal seed layer during the plating process. In an example, copper, tin, and/or nickel, among other metals, can be plated to exposed portions 552 of the metal seed layer 525.

Referring to FIG. 13 and corresponding operation 306 of flowchart 300, the mask 536 of FIG. 12 can be removed. In an embodiment, the mask 536 can be removed using a wet chemical process. In an example, an ink stripping process can be performed to remove the mask 536.

Referring again to FIG. 13 and corresponding operation of flowchart 308, the metal seed layer 525 and second silicon layer 507 of FIG. 12 can be patterned to form isolated second silicon regions 511, 512 of the second conductivity type and to form conductive contacts 538, 539 for the first silicon regions 508 and the isolated second silicon regions 512, respectively. In an embodiment, the patterning can include etching the metal seed layer 525 and second silicon layer 507 of FIG. 12 to form isolated second silicon regions 511, 512 of the second conductivity type and to form conductive contacts 538, 539 for the first silicon regions 508 and the isolated second silicon regions 512. In an embodiment, the etching includes etching the metal seed layer 525 and/or second silicon layer 507 of FIG. 12 using one or more etchants. In an embodiment, a hydroxide-based wet etchant can be used. In one example, the etchant can include potassium hydroxide, tetramethylammonium hydroxide, ammonium hydroxide and/or sodium hydroxide. In some embodiments, the etchant can include an etchant having a weight percent of greater than 2% potassium hydroxide.

In an embodiment, referring to FIGS. 12 and 13, a first etchant can be used to etch the metal seed layer 525. In an example, the first etchant can be potassium hydroxide. In an embodiment, subsequent to etching the metal seed layer 525 using a first etchant, a second etchant can be used to etch the second silicon layer 507. In one embodiment, the first and/or the second etchant can be an alkaline etchant. In an embodiment, the second etchant can include an oxidizer. In an embodiment, the oxidizer can inhibit etching of the metal seed layer 525. In one embodiment, the oxidizer can inhibit undercutting of the metal seed layer 525. In an example, during the etching of the second silicon layer 507, the oxidizer can inhibit etching of lateral portions 543 of the metal seed layer 525 to prevent substantial undercutting at regions adjacent to the etching of the second silicon layer 507. In one example, the patterning can include etching an aluminum-based metal seed layer 525 using potassium hydroxide. Subsequent to etching the aluminum-based metal seed layer 525, the patterning can include etching the second silicon layer 507, where the oxidizer can inhibit etching of lateral portions 543 of the aluminum-based metal seed layer 525 during the etching process. In an example, the patterning can include etching the second silicon layer 507 using potassium hydroxide. In an embodiment, the oxidizer can be hydrogen peroxide and/or ammonium peroxodisulphate.

In an embodiment, the etching can include etching at a temperature in the range of 40-80 degrees Celsius. In an embodiment, referring to FIG. 12 and subsequent to removing the mask 536, the etching can etch portions 550 of the metal seed layer 525, where the metal layer 528 can prevent etching other portions 552 of the metal seed layer 525 during the etching process.

In an embodiment, the metal seed layer 525 can include one, two or more portions. In an example, the metal seed layer 525 can include a first portion including copper, a second layer including tungsten and a third layer including aluminum. In an embodiment, the first, second, third portions, among other portions, can also be referred to as a first, second, third layer, among other layers.

In an embodiment, the etching can include etching a first portion of the metal seed layer 525. In an example, the etching can include etching a copper portion of the metal seed layer. Subsequent to etching the first portion, the etching can include etching a second portion of the metal seed layer. In one example, subsequent to etching a copper portion of the metal seed layer, the etching can include etching an aluminum portion of the metal seed layer. In an embodiment, the aluminum portion of the metal seed layer 525 can be disposed over the first silicon regions 508 and second silicon layer 507. In an embodiment, etching the second portion of the metal seed layer can include etching a second portion of the metal seed layer and the second silicon layer 507 with the same etchant and/or etching both layers at the same etching process step. In an example, the etching can include etching an aluminum portion of the metal seed layer and an n-type doped silicon layer using the same etchant, where the aluminum portion of the metal seed layer is disposed on the n-type doped silicon layer.

Referring once again to FIG. 13, a solar cell 500 is shown fabricated using the methods of FIGS. 1-13 and corresponding to the operations of the flowcharts 200 and 300 of FIGS. 2 and 3, respectively. As shown, the solar cell 500 of FIG. 13 has similar reference numbers to elements of the solar cell 100 of FIG. 1, where like reference numbers refer to similar elements throughout the figures. In an embodiment, the structure of the solar cell 500 of FIG. 5 is substantially similar to the structure of the solar cell 100 of FIG. 1, except as described above. Therefore the description of corresponding portions of FIG. 1 applies equally to the description of FIG. 13. In an example, referring to FIG. 13 and FIG. 1, the first silicon region 508 can correspond to the first polycrystalline silicon emitter region 108. In one example, referring again to FIG. 13 and FIG. 1, the second isolated silicon regions 526, 527 can correspond to the second polycrystalline silicon emitter regions 126, 127.

In an exemplary process flow, FIG. 4 is a flowchart 400 listing operations in another patterning process for a solar cell corresponding to FIGS. 14-16, according to some embodiments. Accordingly, the exemplary process flow moves from the structure of FIG. 10 to the structure of FIG. 14. As shown, the solar cell of FIGS. 14-16 have similar reference numbers to elements of the solar cell of FIGS. 1-13, where like reference numbers refer to similar elements throughout the figures. In an embodiment, the structure of the solar cell of FIGS. 14-16 is substantially similar to the structure of the solar cell of FIGS. 1-13, except as described below. Therefore the description of corresponding portions of FIGS. 1-13 applies equally to the description of FIG. 14-16, except as described below. In various embodiments, the method of FIG. 4 can include additional (or fewer) blocks than illustrated. For example, in some embodiments, a mask need not be removed block 410.

Referring to FIG. 14 and corresponding operation 402 of flowchart 400, a metal layer 640 can be formed over a metal seed layer 625. In an embodiment, forming the metal layer 640 can include placing a metal foil 640 over a metal seed layer 625. In an example, aluminum (e.g., aluminum foil) can be placed over the metal seed layer 625. In an embodiment, placing the metal foil 640 over the metal seed layer 625 can include performing compression process to place the metal foil 640 onto the metal seed layer 625. In some embodiments, a metal seed layer 625 need not be formed, where the metal foil 640 can be placed directly on a first silicon region 608 and/or second silicon layer 607.

Referring again to FIG. 14 and corresponding operation 404 of flowchart 400, the metal layer 640 can be bonded to the metal seed layer 625. In an embodiment, bonding the metal layer 640 to the metal seed layer can include bonding a metal foil 640 to the metal seed layer 625. In an embodiment, the bonding can including welding the metal foil 640 to the metal seed layer 625. In some embodiments, a laser can be used to bond to the metal foil 640 to the metal seed layer 625. In an example, a laser welding process can be used to bond to the metal foil 640 to the metal seed layer 625. In some embodiments, the metal foil 640 can be bonded directly to the first silicon region 608 and/or second silicon layer 607.

Referring to FIG. 15 and corresponding operation 406 of flowchart 400, a mask 636 can be formed over the metal layer 640, according to some embodiments. In an embodiment, forming the mask 636 can include forming the mask over a metal foil 640. In an embodiment, the mask 636 can protect portions 650 of the metal foil 640 during a subsequent etching process, while exposed regions 652 can be etched during said etching process. In an embodiment, the mask 636 can be formed by screen printing, inkjet printing, among other printing processes. In one embodiment, the mask 636 can be an etch resist. In one embodiment, the mask 636 can be a etch resist commonly used in the fabrication or manufacture of solar cells.

Referring to FIG. 16 and corresponding operation 408 of flowchart 400, the metal layer 640 and second silicon layer 607 can be patterned to form isolated second silicon regions 611, 612 of the second conductivity type and to form conductive contacts 638, 639 for the first silicon regions 608 and the isolated second silicon regions 512, respectively. In an embodiment, patterning the metal layer can include patterning a metal foil 640. In an embodiment, the patterning can include etching exposed portions 650 of the metal foil 640, metal seed layer 625 and second silicon layer 607 to form isolated second silicon regions 611, 612 of a second conductivity type to form conductive contacts 638, 639 for the first silicon regions 608 and the isolated second silicon regions 612. In an embodiment, the etching includes etching the metal foil 640, metal seed layer 625 and second silicon layer 607 using one or more etchants. In an example, the etchant can include potassium hydroxide, tetramethylammonium hydroxide, ammonium hydroxide and/or sodium hydroxide. In some embodiments, the etchant can include an etchant having a weight percent of greater than 2% potassium hydroxide.

In an embodiment, the etching includes etching the metal foil 640, metal seed layer 625 and second silicon layer 607 in a single or multiple etching process steps. In an example, the etching process step can include etching with one or more etchants. In an embodiment, a first etchant can be used to etch the metal layer 640 and metal seed layer 625. In an example, the first etchant can be potassium hydroxide. In an embodiment, subsequent to etching the metal layer 640 and the metal seed layer 625 using a first etchant, a second etchant can be used to etch the second silicon layer 607. In one embodiment, the first and/or second etchant can be an alkaline etchant. In an embodiment, the second etchant can include an oxidizer. In an embodiment, the oxidizer can inhibit etching of the metal layer 640 and/or metal seed layer 625. In an example, the metal layer 640 can be a metal foil 640. In one embodiment, the oxidizer can inhibit undercutting of the metal seed layer 625. In an example, during the etching of the second silicon layer 607, an oxidizer can inhibit etching of lateral portions 643, 645 of the metal seed layer 625 and/or metal foil 640, respectively. In an embodiment, the oxidizer can inhibit etching of lateral portions 643 of the metal seed layer 625 to prevent substantial undercutting at regions adjacent to the etching of the second silicon layer 607. In some embodiments, the metal seed layer 625 need not be formed where the metal foil 640 can be disposed directly over the back surface 604 of the substrate 606. In one example, the patterning can include etching an aluminum foil and an aluminum-based metal seed layer using potassium hydroxide. Subsequent to etching an aluminum foil and the aluminum-based metal seed layer 625, the patterning can include etching the second silicon layer 607 using a second etchant, where the second etchant can include an oxidizer to inhibit etching of lateral portions 643, 645 of an aluminum-based metal seed layer and aluminum foil, respectively. In some embodiments, the aluminum-based metal seed layer need not be formed. In an embodiment, the oxidizer can be hydrogen peroxide and/or ammonium peroxodisulphate.

In an embodiment, the etching can include etching at a temperature in the range of 40-80 degrees Celsius. In some embodiments, the etching can include etching exposed portions of the metal foil 640, metal seed layer 625 and second silicon layer 607 of FIG. 12 in a same etching process step.

Referring again to FIG. 16 and corresponding operation 410 of flowchart 400, the mask 636 can be removed. In an embodiment, the mask can be removed using a wet chemical process. In an example, an ink stripping process can be performed to remove the mask 636. In some embodiments, the mask 636 need not be removed.

Referring once again to FIG. 16, a solar cell 600 is shown fabricated using the methods of FIGS. 1-10 and 14-16 and corresponding to the operations of the flowcharts 200 and 400 of FIGS. 2 and 4. As shown, the solar cell of FIG. 600 of FIG. 16 have similar reference numbers to elements of the solar cell 100 of FIG. 1, where like reference numbers refer to similar elements throughout the figures. In an embodiment, the structure of the solar cell 600 of FIG. 16 is substantially similar to the structure of the solar cell 100 of FIG. 1, except as described above. Therefore the description of corresponding portions of FIG. 1 applies equally to the description of FIG. 16. In an example, referring to FIG. 16 and FIG. 1, the first silicon region 608 can correspond to the first polycrystalline silicon emitter region 108. In one example, referring again to FIG. 16 and FIG. 1, the second isolated silicon regions 626, 627 can correspond to the second polycrystalline silicon emitter regions 126, 127.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A back contact solar cell, comprising:
   a substrate having a light-receiving surface and a back surface;
   a first polycrystalline silicon emitter region of a first conductivity type disposed on a first thin dielectric layer disposed on the back surface of the substrate, wherein the first thin dielectric layer is sandwiched by and is directly contacting the substrate and the first polysilicon emitter region;
   a second polycrystalline silicon emitter region of a second, different, conductivity type disposed on a second thin dielectric layer disposed on the back surface of the substrate;
   a third thin dielectric layer disposed over an exposed outer portion of the first polycrystalline silicon emitter region and disposed laterally directly between the first and second polycrystalline silicon emitter regions, wherein the lateral region of the third thin dielectric layer is sandwiched by and is directly contacting the first and second polycrystalline silicon emitter regions;
   a first conductive contact structure disposed over the first polycrystalline silicon emitter region; and
   a second conductive contact structure disposed over the second polycrystalline silicon emitter region.

2. The back contact solar cell of claim 1, further comprising:
   an insulator layer disposed on the first polycrystalline silicon emitter region, wherein the first conductive contact structure is disposed through the insulator layer, and wherein a portion of the second polycrystalline silicon emitter region overlaps the insulator layer but is separate from the first conductive contact structure.

3. The back contact solar cell of claim 2, wherein the insulator layer comprises an oxynitride or a nitride.

4. The back contact solar cell of claim 1, further comprising:
   an amorphous silicon region disposed over the second polycrystalline silicon emitter region.

5. The back contact solar cell of claim 1, further comprising:
   a silicon nitride region disposed over the second polycrystalline silicon emitter region.

6. The back contact solar cell of claim 1, further comprising:
   an insulator layer disposed on the first polycrystalline silicon emitter region; and a polycrystalline silicon layer of the second conductivity type disposed on the insulator layer, wherein the first conductive contact structure is disposed through the polycrystalline silicon layer of the second conductivity type and through the insulator layer.

7. The back contact solar cell of claim 1, wherein the second polycrystalline silicon emitter region and the second thin dielectric layer are disposed in a recess disposed in the substrate.

8. The back contact solar cell of claim 7, wherein the recess has a texturized surface.

9. The back contact solar cell of claim 1, wherein the first polycrystalline silicon emitter region and the first thin dielectric layer are disposed on a flat portion of the back surface of the substrate, and wherein the second polycrystalline silicon emitter region and the second thin dielectric layer are disposed on a texturized portion of the back surface of the substrate.

10. The back contact solar cell of claim 1, wherein the first and second conductive contact structures each comprises an aluminum-based metal seed layer disposed on the first and second polycrystalline silicon emitter regions, respectively, and each further comprises a metal layer disposed on the aluminum-based metal seed layer.

11. The back contact solar cell of claim 1, further comprising:

a fourth thin dielectric layer disposed on the light-receiving surface of the substrate;

a polycrystalline silicon layer of the second conductivity type disposed on the fourth thin dielectric layer; and an anti-reflective coating (ARC) layer disposed on the polycrystalline silicon layer of the second conductivity type.

12. The back contact solar cell of claim 1, wherein the substrate is an N-type monocrystalline silicon substrate, the first conductivity type is P-type, and the second conductivity type is N-type.

13. The back contact solar cell of claim 1, wherein all of the first, second and third thin dielectric layers comprise silicon dioxide.

14. The back contact solar cell of claim 1, wherein the second polycrystalline silicon emitter region is disposed on a portion of the third thin dielectric layer disposed over the exposed outer portion of the first polycrystalline silicon emitter region.

15. A back contact solar cell, comprising:
a substrate having a light-receiving surface and a back surface;
a P-type emitter region disposed on a first thin dielectric layer disposed on the back surface of the substrate, wherein the first thin dielectric layer is sandwiched by and is directly contacting the substrate and the P-type emitter region;
an N-type emitter region disposed on a second thin dielectric layer disposed on the back surface of the substrate;
a third thin dielectric layer disposed over an exposed outer portion of the P-type emitter region and disposed laterally directly between the P-type and the N-type emitter regions, wherein the lateral region of the third thin dielectric layer is sandwiched by and is directly contacting the P-type and the N-type emitter regions;
a first conductive contact structure disposed over the P-type emitter region; and a second conductive contact structure disposed over the N-type emitter region.

16. The back contact solar cell of claim 15, wherein the N-type emitter region and the second thin dielectric layer are disposed in a recess disposed in the substrate, and wherein the recess has a texturized surface.

17. The back contact solar cell of claim 15, wherein the N-type emitter region is disposed on a portion of the third thin dielectric layer disposed over the exposed outer portion of the P-type emitter region.

18. A back contact solar cell, comprising:
a substrate having a light-receiving surface and a back surface;
an N-type emitter region disposed on a first thin dielectric layer disposed on the back surface of the substrate, wherein the first thin dielectric layer is sandwiched by and is directly contacting the substrate and the N-type emitter region;
a P-type emitter region disposed on a second thin dielectric layer disposed on the back surface of the substrate;
a third thin dielectric layer disposed over an exposed outer portion of the N-type emitter region and disposed laterally directly between the N-type and the P-type emitter regions, wherein the lateral region of the third thin dielectric layer is sandwiched by and is directly contacting the P-type and the N-type emitter regions;
a first conductive contact structure disposed over the N-type emitter region; and
a second conductive contact structure disposed over the P-type emitter region.

19. The back contact solar cell of claim 18, wherein the P-type emitter region and the second thin dielectric layer are disposed in a recess disposed in the substrate, and wherein the recess has a texturized surface.

20. The back contact solar cell of claim 18, wherein the P-type emitter region is disposed on a portion of the third thin dielectric layer disposed over the exposed outer portion of the N-type emitter region.

* * * * *